United States Patent
Zhao et al.

(10) Patent No.: US 8,520,398 B2
(45) Date of Patent: Aug. 27, 2013

(54) ELECTRONIC DEVICE WITH CONDUCTIVE RESILIENT SHEET

(75) Inventors: Guan-Dong Zhao, Shenzhen (CN);
Xue-Feng Wan, Shenzhen (CN);
Zhao-Yong Li, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 156 days.

(21) Appl. No.: 13/117,327

(22) Filed: May 27, 2011

(65) Prior Publication Data
US 2012/0250266 A1    Oct. 4, 2012

(30) Foreign Application Priority Data
Apr. 1, 2011 (CN) ............ 2011 1 0081415

(51) Int. Cl.
*H05K 5/00* (2006.01)

(52) U.S. Cl.
USPC ........... 361/752; 361/719; 361/726; 361/801; 361/804; 361/759

(58) Field of Classification Search
None
See application file for complete search history.

(56) References Cited

U.S. PATENT DOCUMENTS

| | | | | |
|---|---|---|---|---|
| 3,479,634 A * | 11/1969 | Pritulsky | | 439/560 |
| 3,617,980 A * | 11/1971 | Alkire et al. | | 439/223 |
| 3,996,500 A * | 12/1976 | Coules | | 361/748 |
| 4,423,920 A * | 1/1984 | Cooper et al. | | 439/62 |
| 4,497,012 A * | 1/1985 | Gottlieb et al. | | 361/306.2 |
| 4,647,126 A * | 3/1987 | Sobota, Jr. | | 439/74 |
| 4,991,666 A * | 2/1991 | Septfons et al. | | 174/261 |
| 5,251,104 A * | 10/1993 | Wandt et al. | | 361/736 |
| 5,537,294 A * | 7/1996 | Siwinski | | 361/753 |
| 5,772,449 A * | 6/1998 | Feldmeier et al. | | 439/66 |
| 5,885,118 A * | 3/1999 | Billenstein et al. | | 439/862 |
| 6,051,781 A * | 4/2000 | Bianca et al. | | 174/351 |
| 6,063,999 A * | 5/2000 | Kelly | | 174/351 |
| 6,233,156 B1* | 5/2001 | Liao | | 361/759 |
| 6,239,977 B1* | 5/2001 | Price et al. | | 361/737 |
| 6,267,629 B1* | 7/2001 | Nguyen et al. | | 439/857 |
| 6,308,394 B1* | 10/2001 | Boe | | 29/450 |
| 6,424,540 B1* | 7/2002 | Chen et al. | | 361/759 |
| 6,621,717 B2* | 9/2003 | Tuttle et al. | | 361/818 |
| 6,781,843 B2* | 8/2004 | Liu et al. | | 361/726 |
| 6,813,163 B2* | 11/2004 | Inoue et al. | | 361/784 |
| 6,837,554 B2* | 1/2005 | Yamamoto et al. | | 312/223.2 |
| 6,872,881 B2* | 3/2005 | Horng | | 174/384 |
| 6,896,561 B2* | 5/2005 | Lai | | 439/862 |
| 6,992,901 B1* | 1/2006 | Hung | | 361/818 |
| 6,994,565 B2* | 2/2006 | Harper, Jr. | | 439/66 |
| 7,082,037 B2* | 7/2006 | Schremmer | | 361/737 |
| 7,095,617 B1* | 8/2006 | Ni | | 361/736 |
| 8,246,125 B2* | 8/2012 | Chen | | 312/223.2 |
| 8,363,424 B2* | 1/2013 | Lai | | 361/818 |

(Continued)

*Primary Examiner* — Adrian S Wilson
*Assistant Examiner* — Abhishek Rathod
(74) *Attorney, Agent, or Firm* — Altis Law Group, Inc.

(57) ABSTRACT

An electronic device includes a supporting member, a circuit board fixed to the supporting member, a bottom cover assembled with the supporting member, and at least one conductive resilient sheet fixed on the circuit board. The conductive resilient sheet includes a fixing portion fixed on the circuit board and a conductive portion. The conductive portion defines a first elastic sheet and a second elastic sheet. The bottom cover is fixed between the first elastic sheet resisting the outer side of the bottom cover and the second elastic sheet resisting the inner side of the bottom cover.

9 Claims, 4 Drawing Sheets

(56) References Cited

U.S. PATENT DOCUMENTS

| | | | |
|---|---|---|---|
| 8,369,061 B2* | 2/2013 | Chu | 361/220 |
| 2002/0181212 A1* | 12/2002 | Paquin et al. | 361/752 |
| 2004/0100762 A1* | 5/2004 | Yuan et al. | 361/685 |
| 2006/0114662 A1* | 6/2006 | Liu et al. | 361/759 |
| 2007/0052100 A1* | 3/2007 | Bellinger | 257/758 |
| 2009/0154134 A1* | 6/2009 | Hassler | 361/818 |
| 2010/0276948 A1* | 11/2010 | Shih et al. | 292/191 |
| 2011/0188226 A1* | 8/2011 | Kim | 361/818 |

* cited by examiner

ELECTRONIC DEVICE WITH CONDUCTIVE RESILIENT SHEET

BACKGROUND

1. Technical Field

The present disclosure relates to electronic devices, particularly to an electronic device with a plurality of conductive resilient sheets for electromagnetic interference (EMI) shielding.

2. Description of Related Art

In the enclosure of a typical electronic device, there are many kinds of electronic components, such as central processing units and accelerated chips, mounted in a circuit board of the enclosure. The electronic components may emit electromagnetic radiation when operating, such that electromagnetic interference between the electronic components occurs. Some of the electronic components in the enclosure may work abnormally due to EMI. To decrease or overcome the EMI of the enclosure, a conductive resilient sheet is provided to connect the circuit board of an electronic device with the housing. The conductive resilient sheet can reduce or even stop EMI that is produced by the circuit board effectively.

However, poor contact of the conductive resilient sheet and the housing often occurs when an external force shakes the electronic device.

Therefore, there is room for improvement in the art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the electronic device. Moreover, in the drawings like reference numerals designate corresponding parts throughout the several views. Wherever possible, the same reference numerals are used throughout the drawings to refer to the same or like elements of an embodiment.

DETAILED DESCRIPTION

Figure 1:
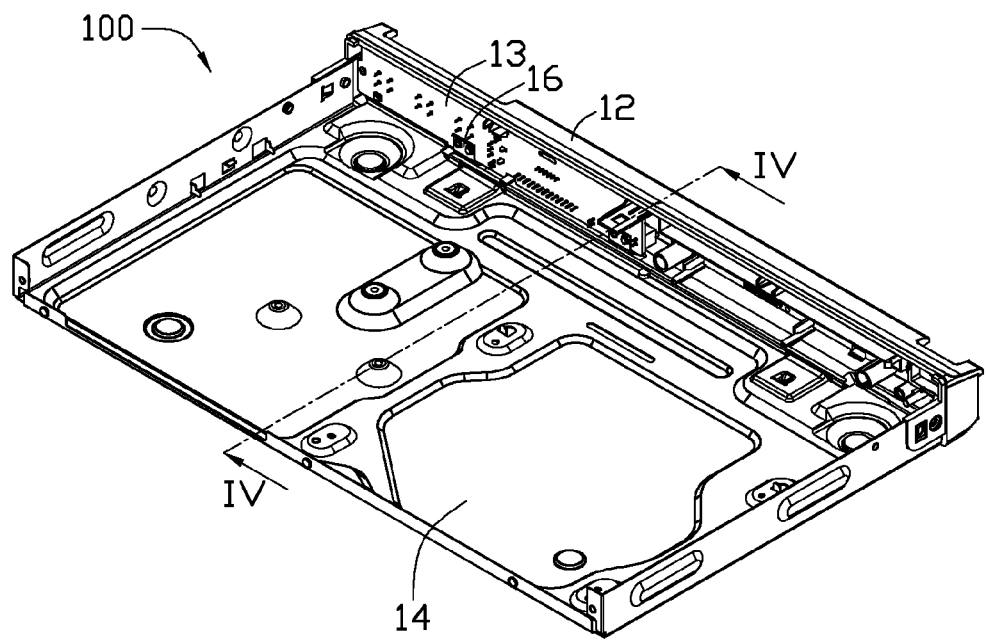
FIG. 1 is a partial, isometric view of an embodiment of an electronic device; the electronic device includes two conductive resilient sheets.
Figure 2:
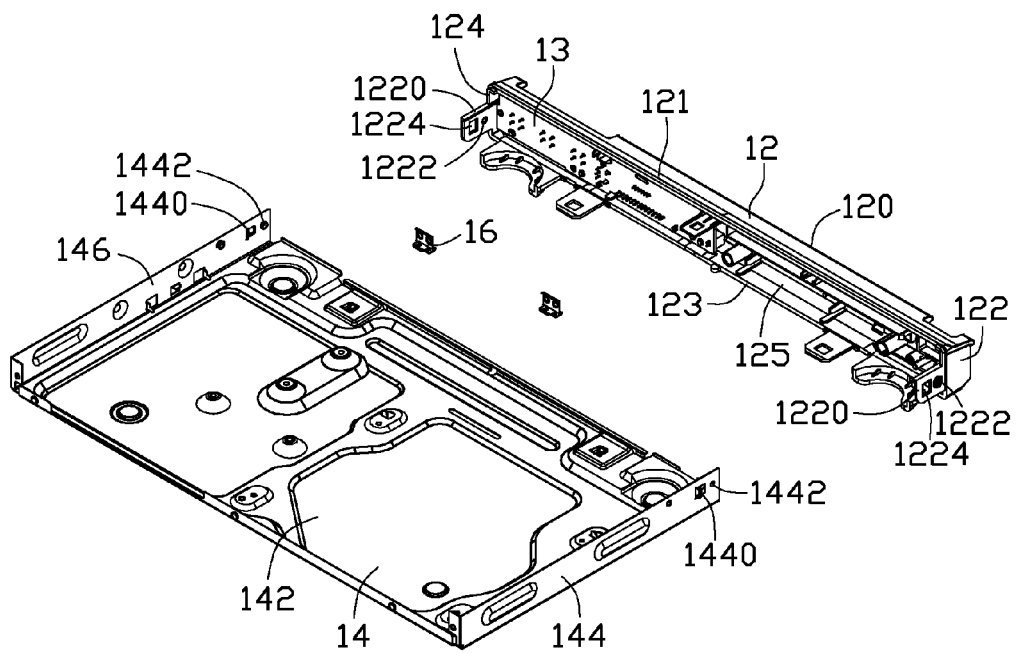
FIG. 2 is an exploded, isometric view of the electronic device of FIG. 1.

Referring to FIG. 1 and FIG. 2, an embodiment of an electronic device 100 includes a supporting member 12, a circuit board 13 fixed to the supporting member 12, a bottom cover 14 and two conductive resilient sheets 16 for EMI shielding. The supporting member 12 is fixed to the bottom cover 14 at one side of the bottom cover 14. The two conductive resilient sheets 16 are both fixed on the circuit board 13 and resist the bottom cover 14. The electronic device 100 may be a notebook computer, a desktop computer, a liquid crystal display, or other electronic devices. In the illustrated embodiment, the electronic device 100 is a DVD video player.

The supporting member 12 can be a substantially elongated rectangular sheet. The supporting member 12 includes a base portion 120 and four side walls 121, 122, 123, 124 extending upward from four edges of the base portion 120. The base portion 120 and the four side walls 121, 122, 123, 124 cooperatively define a cavity 125 to receive the circuit board 13. The side walls 122, 124 are opposite to each other. Each of the side walls 122, 124 forms an engaging portion 1220 extending out from a top end of the side walls 122, 124. Each of the engaging portions 1220 defines a locking hole 1222 and a latching hole 1224 aligned separate from the locking hole 1222 adjacent to a top of each of the engaging portions 1220.

The bottom cover 14 includes a bottom plate 142, a first side frame 144 and a second side frame 146 extending upward from two opposite edges of the bottom plate 142. Each of the side frames 144, 146 forms a latching hook 1440 corresponding to the latching holes 1224 of the two engaging portions 1220. Each of the latching hooks 1440 is formed at an end of each side frames 144, 146 adjacent to the supporting member 12. Each side frames 144, 146 further defines a positioning hole 1442 corresponding to one locking hole 1222 adjacent to and apart from the latching hook 1440.

Figure 3:
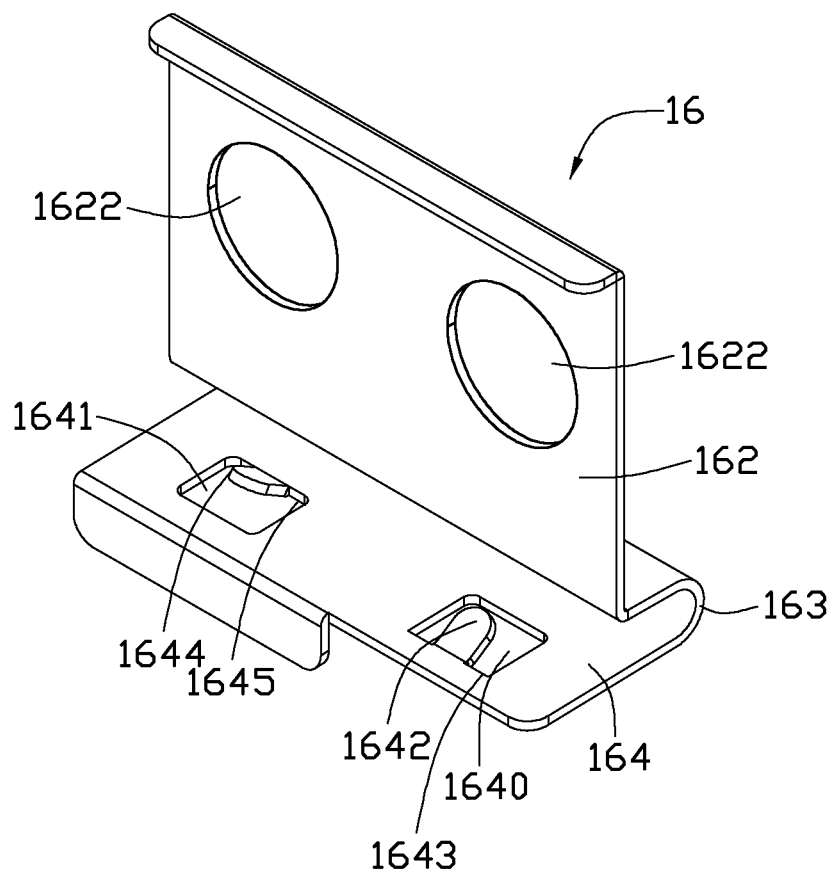
FIG. 3 is an enlarged, isometric view of the conductive resilient sheet of the electronic device of FIG. 2.

Referring to FIG. 3, the conductive resilient sheet 16 is made of conductive materials and can be formed by punching. Each of the sheets 16 includes a fixing portion 162, a U-shaped connecting portion 163, and a conductive portion 164. The conductive portion 164 extends from an end of the connecting portion 163 along the same plane. The fixing portion 162 extends from the other end of the connecting portion 163 and bends outward substantially perpendicularly to the conductive portion 164. The fixing portion 162 defines two fixing holes 1622 arranged apart. The sheet 16 is fixed on the circuit board 13 with two screws (not shown) extending through the corresponding fixing holes 1622. The conductive portion 164 defines a first through hole 1640 and a second through hole 1641. The two through holes 1640, 1641 are arranged apart and adjacent to an edge of the conductive portion 164 and away from the connecting portion 163. A first elastic sheet 1642 and a second elastic sheet 1644 are formed on the conductive portion 164 toward the fixing portion 162. The sheet 1642 extends out from an inner side wall 1643 of the through hole 1640 apart from the connecting portion 163. The sheet 1644 extends out from an inner side wall 1645 of the through hole 1641 adjacent to the connecting portion 163.

During the assembly of the electronic device 100, the circuit board 13 is fixed in the cavity 125, and the sheet 16 is fixed on the circuit board 13 with two screws extending through the corresponding fixing holes 1622. The bottom cover 14 moves toward the supporting member 12 until the latching hooks 1440 engage with the latching holes 1224 correspondingly. Two bolts (not shown) extend through the locking holes 1222, 1442 correspondingly to lock the supporting member 12 to the bottom cover 14.

Figure 4:
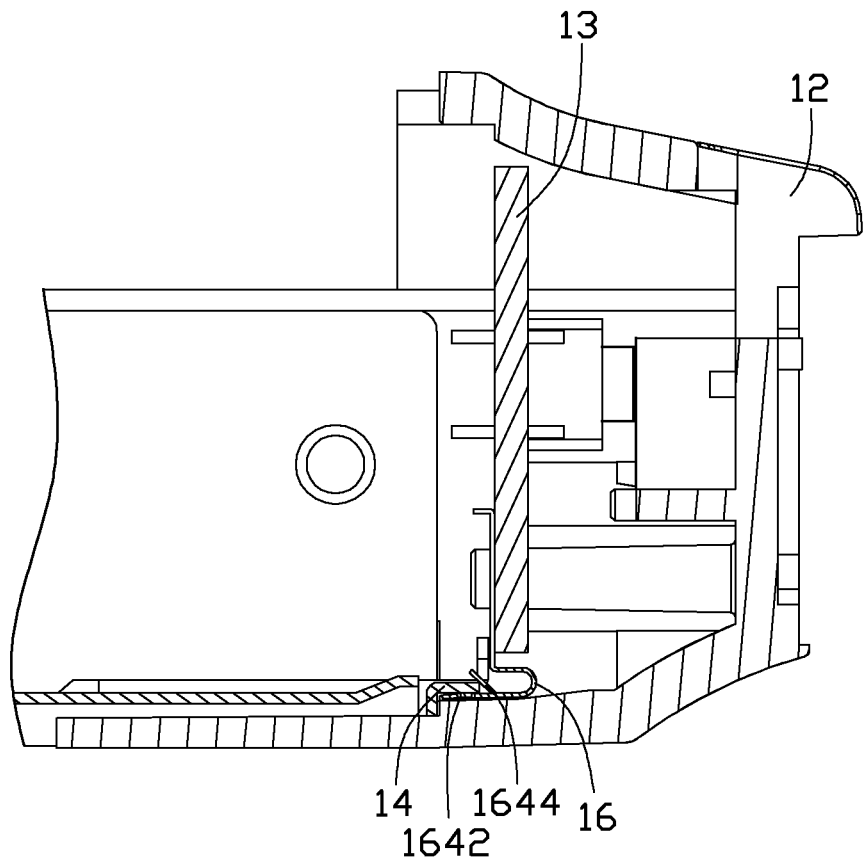
FIG. 4 is a partial, cross-section of the electronic device of FIG. 1, taken along line IV-IV.

Referring to FIG. 4, the fixing portion 162 is fixed on the circuit board 13. The supporting member 12 is fixed to the bottom cover 14 at one side of the bottom cover 14, and an edge of the bottom plate 142 adjacent to the supporting member 12 is inserted between the sheet 1642 and the sheet 1644. At this time, the first elastic sheet 1642 resists an outer surface of the bottom plate 142 and the second elastic sheet 1644 resists an inner surface of the bottom plate 142. When an external force shakes the electronic device 100, the bottom cover 14 will always maintain contact with the circuit board 13.

It is believed that the present embodiments and their advantages will be understood from the foregoing description, and it will be apparent that various changes may be made thereto without departing from the spirit and scope of the embodiments or sacrificing all of its material advantages.

What is claimed is:

1. An electronic device, comprising:
   a supporting member;
   a circuit board fixed on the supporting member;
   a bottom cover assembled with the supporting member; and
   at least one conductive resilient sheet comprising a fixing portion fixed on the circuit board and a conductive portion, wherein the conductive portion comprises a first elastic sheet and a second elastic sheet, and the bottom cover is fixed between the first elastic sheet resisting an outer surface of the bottom cover and the second elastic sheet resisting an inner surface of the bottom cover opposite to the outer surface of the bottom cover;
   wherein at least one fixing hole is defined in the fixing portion, and the conductive resilient sheet is fixed on the circuit board by a fastener threaded through a corresponding at least one fixing hole.

2. The electronic device of claim 1, wherein the conductive portion further comprises a first through hole and a second through hole arranged apart and adjacent to an edge thereof, the first elastic sheet extends out from an inner side wall of the first through hole apart from the connecting portion and the second elastic sheet extends out from an inner side wall of the second through hole adjacent to the connecting portion.

3. The electronic device of claim 1, wherein the conductive resilient sheet further comprises a U-shaped connecting portion, the conductive portion extends from an end of the U-shaped connecting portion along a same plane, and the fixing portion extends from another end of the U-shaped connecting portion and bends outwardly and substantially perpendicularly to the conductive portion.

4. The electronic device of claim 1, wherein the supporting member comprises a base portion and four side walls extending upward from four edges of the base portion to cooperatively define a cavity to receive the circuit board.

5. The electronic device of claim 4, wherein two opposite side walls of the four side walls each comprises an engaging portion extending out from a top end thereof.

6. The electronic device of claim 5, wherein the bottom cover comprises a bottom plate, a first side frame, and a second side frame, and the first and second side frames extend upwardly from two opposite edges of the bottom plate.

7. The electronic device of claim 6, wherein each of the first and second side frames forms a latching hook corresponding to the latching holes of the two engaging portions, and each of the latching hooks is formed at the end of each of the side frames adjacent to the supporting member.

8. The electronic device of claim 7, wherein each of the first and second side frames defines a positioning hole corresponding to one locking hole adjacent to and apart from the latching hook.

9. An electronic device, comprising:
   a supporting member;
   a bottom cover assembled with the supporting member; and
   at least one conductive resilient sheet fixed on the supporting member, wherein the conductive resilient sheet comprises a fixing portion and a conductive portion comprising a first elastic sheet and a second elastic sheet, and the bottom cover is fixed between the first elastic sheet and the second elastic sheet, with the first elastic sheet resisting an inner surface of the bottom cover and the second elastic sheet resisting an outer surface of the bottom cover opposite to the outer surface of the bottom cover;
   wherein at least one fixing hole is defined in the fixing portion, and the conductive resilient sheet is fixed on the supporting member by a fastener threaded through a corresponding at least one fixing hole.

* * * * *